(12) United States Patent
Yang et al.

(10) Patent No.: US 8,278,733 B2
(45) Date of Patent: Oct. 2, 2012

(54) BONDING PAD STRUCTURE AND INTEGRATED CIRCUIT CHIP USING SUCH BONDING PAD STRUCTURE

(75) Inventors: Ming-Tzong Yang, Hsinchu County (TW); Yu-Hua Huang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 201 days.

(21) Appl. No.: 12/729,224

(22) Filed: Mar. 22, 2010

(65) Prior Publication Data

US 2011/0049671 A1 Mar. 3, 2011

Related U.S. Application Data

(60) Provisional application No. 61/236,541, filed on Aug. 25, 2009.

(51) Int. Cl.
*H01L 23/48* (2006.01)
*H01L 23/485* (2006.01)

(52) U.S. Cl. . 257/531; 257/758; 257/784; 257/E23.011; 257/E23.019; 257/E23.062

(58) Field of Classification Search .................. 257/531, 257/758, 784, E23.011, E23.019, E23.02
See application file for complete search history.

(56) References Cited

U.S. PATENT DOCUMENTS

| | | | |
|---|---|---|---|
| 6,281,046 B1 | 8/2001 | Lam | |
| 6,319,751 B1* | 11/2001 | Lin | 438/108 |
| 7,183,625 B2* | 2/2007 | Hsieh | 257/531 |
| 7,250,682 B2* | 7/2007 | Koubuchi et al. | 257/766 |
| 7,964,973 B2* | 6/2011 | Lin et al. | 257/774 |
| 2002/0125581 A1* | 9/2002 | Lin | 257/778 |
| 2003/0080428 A1* | 5/2003 | Izumitani et al. | 257/758 |
| 2005/0184357 A1* | 8/2005 | Chiba | 257/531 |
| 2005/0253269 A1* | 11/2005 | Tsuda | 257/758 |
| 2007/0205520 A1* | 9/2007 | Chou et al. | 257/780 |
| 2008/0284026 A1* | 11/2008 | Hashimoto et al. | 257/758 |
| 2009/0057922 A1 | 3/2009 | Lee et al. | |
| 2009/0102021 A1 | 4/2009 | Chen et al. | |
| 2010/0301483 A1* | 12/2010 | Gaebler | 257/758 |

FOREIGN PATENT DOCUMENTS

| | | |
|---|---|---|
| CN | 1426599 A | 6/2003 |
| CN | 101378039 A | 3/2009 |
| CN | 101414589 A | 4/2009 |

* cited by examiner

*Primary Examiner* — Victor A Mandala
(74) *Attorney, Agent, or Firm* — Winston Hsu; Scott Margo

(57) ABSTRACT

An integrated circuit chip includes a substrate; a topmost metal layer over the substrate; a lower metal layer on or over the substrate and lower than the topmost metal layer; and at least one bonding pad in the lower metal layer.

20 Claims, 2 Drawing Sheets

BONDING PAD STRUCTURE AND INTEGRATED CIRCUIT CHIP USING SUCH BONDING PAD STRUCTURE

CROSS REFERENCE TO RELATED APPLICATIONS

This application claims the benefit of U.S. provisional application No. 61/236,541 filed Aug. 25, 2009, which is incorporated herein by reference.

BACKGROUND OF THE INVENTION

1. Field of the Invention

The present invention relates generally to the semiconductor technology. More particularly, the invention relates to an improved bonding pad structure in an integrated circuit chip.

2. Description of the Prior Art

An urgent demand for smaller and cheaper electronic products with increased functionality and performance exists. A major trend of circuit design is to incorporate as many circuit components into integrated circuit as possible, whereby cost per wafer can be reduced.

Integrated circuits are manufactured by forming semiconductor devices in the surface of silicon wafers. A multi-level interconnection is formed over the devices, contacting their active elements, and wiring them together to create the desired circuits. The wiring layers are formed by depositing a dielectric layer over the devices, patterning and etching contact openings into this layer, and then depositing conductive material into the openings. A conductive layer is applied over the dielectric layer and patterned to form wiring interconnection between the device contacts, thereby creating a first level of basic circuitry. The circuits are then further interconnected by utilizing additional wiring levels laid out over additional dielectric layers with conductive via.

Depending upon the complexity of the overall integrated circuit, several levels of wiring interconnections are used. On the uppermost level the wiring is terminated at metal pads to which the chip's external wiring connections are bonded. A top metal layer or an aluminum layer may be used in the integrated circuits, for example, for the fabrication of an RF device such as an integrated inductor, a MOM capacitor, a resistor, or a redistribution layer (RDL).

Bonding pads also exist in the top metal layer. During wire bonding process, undesired, conspicuous deformation of the bonding pad occurs due to the stress exerted thereon. The deformed bonding pad may cause the fracture defects in the passivation layer that covers the periphery of the bonding pad. To cope with this problem, the pad opening and/or the space between two pads are typically enlarged. However, increasing the pad opening and the pad pitch results in larger chip size and higher cost.

SUMMARY OF THE INVENTION

It is one object of the invention to provide an improved bonding pad structure in an integrated circuit chip to solve the problem of bonding pad deformation.

According to one embodiment of this invention, in one aspect, an integrated circuit chip includes a substrate; a topmost metal layer over the substrate; a lower metal layer on or over the substrate and lower than the topmost metal layer; and at least one bonding pad in the lower metal layer.

From another aspect of the invention, an integrated circuit chip includes a substrate; a topmost metal layer over the substrate; an inductor formed in the topmost metal layer within an inductor forming region of the integrated circuit chip; a lower metal layer on or over the substrate and lower than the topmost metal layer; and at least one bonding pad formed in the lower metal layer within a bonding pad forming region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The preferred embodiments of this invention will now be explained with the accompanying figures. Throughout the specification and drawings, the symbol "$M_n$" refers to the topmost level of the metal layers, such as an aluminum redistribution layer (RDL), fabricated in the integrated circuit chip, while "$M_{n-1}$" refers to the metal layer that is one level lower than the topmost metal layer and so on, wherein, preferably, n ranges between 2 and 10 (n=2-10), but not limited thereto. The symbol "V" refers to the via plug connecting two adjacent metal layers. For example, $V_5$ refers to the via plug interconnecting $M_5$ to $M_6$.

Figure 1:
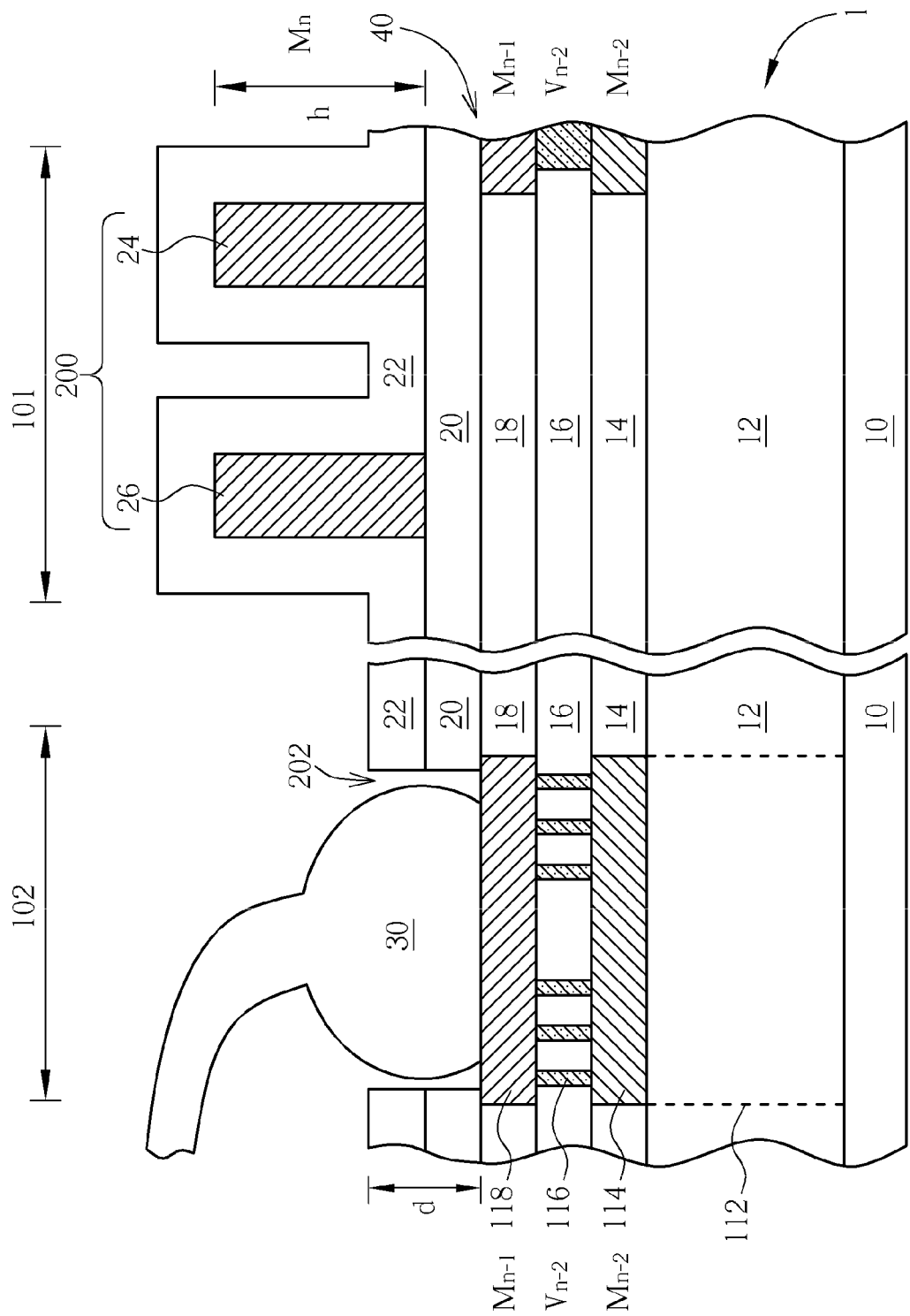
FIG. 1 is a schematic, cross-sectional diagram illustrating portions of an integrated circuit chip in accordance with one embodiment of this invention.

Please refer to FIG. 1. FIG. 1 is a schematic, cross-sectional diagram illustrating portions of an integrated circuit chip 1 in accordance with one embodiment of this invention. It is understood that the layers or elements in the figures are not drawn to scale and are modified for the sake of clarity. The integrated circuit chip 1 may include an RF integrated circuit incorporating a top metal layer ($M_n$) for an RF device, such as inductor or any other devices suitable for RF circuit. The top metal layer ($M_n$) for the RF device may be an aluminum layer, a copper layer or a copper alloy layer, preferably, aluminum layer.

The top metal layer could reduce parasitic losses and hence improves the quality factor Q of the RF integrated circuit. In this embodiment, thickness of the top metal layer is not less than 0.5 micrometer. In some embodiments, the top metal layer has a thickness not less than 1.0 micrometer. In some further embodiments, the top metal layer has a thickness not less than 3.0 micrometer.

As shown in FIG. 1, the integrated circuit chip 1 comprises a substrate 10 such as a silicon substrate. The substrate 10 may be any suitable semiconductor substrate such as SiGe substrate or silicon-on-insulator (SOI) substrate. A base layer 12 including but not limited to a device layer such as MOS or bipolar devices and at least one inter-layer dielectric (ILD) is formed on the substrate 10. For the sake of simplicity, the interconnection including wiring and contact/via in the base layer 12 are not shown. A plurality of inter-metal dielectric (IMD) layers 14, 16, 18 and 20, including the topmost IMD layer 20, are provided on the base layer 12. Each of the plurality of IMD layers 14, 16, 18 and 20 may include, but not limited to, silicon oxide, silicon nitride, silicon carbide, silicon oxy-nitride, low-k or ultra low-k (ULK) materials such as organic (e.g., SILK) or inorganic (e.g., HSQ), or a combination thereof. A passivation layer 22 overlies at least a portion of the IMD layer 20. The passivation layer 22 may be silicon oxide, silicon nitride, silicon carbide, silicon oxy-nitride, polyimide, a combination thereof or the like. According to this embodiment, the passivation layer 22 has a thickness of about 0.5-6.0 micrometers, but should be not limited thereto.

A multiple levels of metal interconnection 40 may be fabricated in the respective IMD layers 14, 16, 18 and 20. For the sake of simplicity, only $M_{n-2}$, $V_{n-2}$, $M_{n-1}$ and $M_n$ are explicitly shown in the figures. An RF device, such as an inductor 200, which may comprise a first winding 24 and a second winding 26 in proximity to the first winding 24, is fabricated in the top metal layer ($M_n$) within the inductor forming region 101 of the integrated circuit chip 1. According to the embodiment of this invention, the top metal layer ($M_n$) has a thickness h that is not less than 0.5 micrometer. In some embodiments, the top metal layer has a thickness not less than 1.0 micrometer. In some further embodiments, the top metal layer has a thickness not less than 3.0 micrometer. The sidewalls and top surfaces of the first winding 24 and the second winding 26 of the inductor 200 could be covered with the passivation layer 22. Although the embodiment takes an inductor as an example, the invention is not intended to be limited thereto. It is to be understood that other RF devices such as an MOM capacitor or a resistor may be formed from the top metal layer $M_n$. Further, the top metal layer $M_n$ may be used to form a redistribution layer (RDL).

According to the embodiment of this invention, the metal layer $M_{n-1}$ in which at least one bonding pad 118 is formed could be made of aluminum, while the metal layer $M_{n-2}$ could be formed by conventional copper damascene methods such as single damascene methods or dual damascene methods. For example, the metal layer $M_{n-2}$ could be formed by single damascene methods, while the metal layer $M_{n-1}$ and the integral via plug layer $V_{n-2}$ could be formed by conventional aluminum process. Besides, $M_{n-2}$ could be made of aluminum. As known in the art, the copper damascene methods provide a solution to form a conductive wire coupled with an integral via plug without the need of dry etching copper. Either a single damascene or a dual damascene structure may be used to connect devices and/or wires of an integrated circuit.

The integrated circuit chip 1 comprises a bonding pad forming region 102. At least one bonding pad 118 is formed in the metal layer $M_{n-1}$ within the bonding pad forming region 102. The metal layer $M_{n-1}$ could be thinner than the top metal layer ($M_n$). For example, the metal layer $M_{n-1}$ may have a thickness of about 0.2-1 micrometers. An opening 202 is formed in the passivation layer 22 and the IMD layer 20 to expose at least a portion of the top surface of the bonding pad 118 such that a bond wire 30 may be stuck to the bonding pad 118 in a package assembly stage. The opening 202 may have a depth of about 0.8-6.0 micrometers. According to the embodiment of this invention, the bonding pad 118 is preferably an aluminum pad, but not limited thereto.

Optionally, supporting structures 114 and 116 may be formed underneath the bonding pad 118. The supporting structures 114 and 116 may be in any suitable shapes and configurations to provide adequate mechanical support for the bonding pad 118 during the wire boding process. For example, the supporting structure 114 may be a dummy metal plate that is fabricated in the metal layer $M_{n-2}$, while the supporting structure 116 may be a plurality of via plugs connecting the supporting structure 114 with the bonding pad 118. In addition, within the area 112 under the bonding pad 118, active circuit, circuit elements or interconnections (not shown) may be formed.

Figure 2:
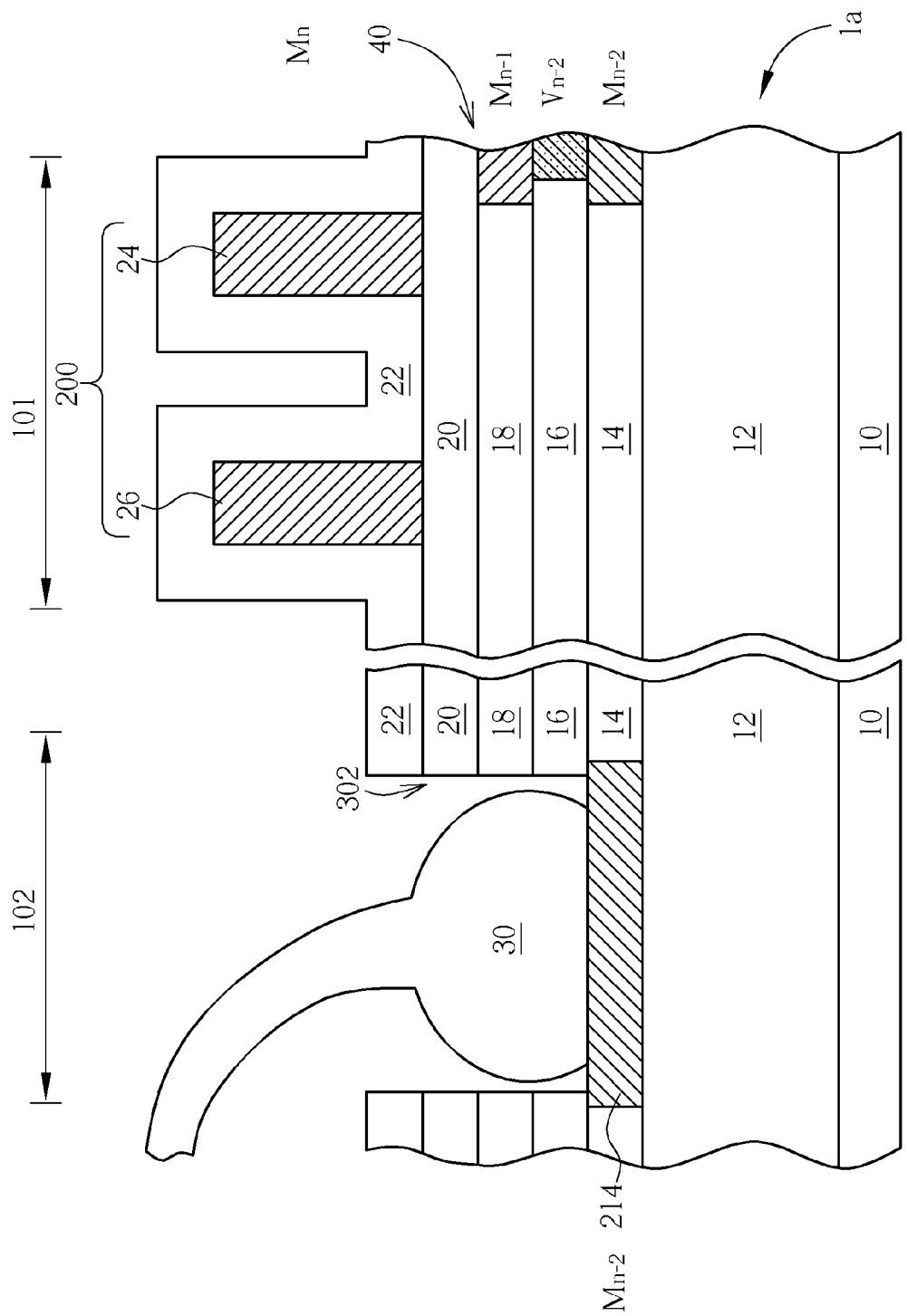
FIG. 2 is a schematic, cross-sectional diagram illustrating portions of an integrated circuit chip in accordance with one embodiment of this invention.

FIG. 2 is a schematic, cross-sectional diagram illustrating portions of an integrated circuit chip 1a in accordance with one embodiment of this invention, wherein like layers, regions or elements are designated by like numeral numbers. It is understood that the layers or elements in the figures are not drawn to scale and are modified for the sake of clarity. As shown in FIG. 2, likewise, the integrated circuit chip 1a comprises a substrate 10. A base layer 12 and a plurality of IMD layers 14, 16, 18 and 20, including the topmost IMD layer 20, are provided on the substrate 10. Each of the plurality of IMD layers 14, 16, 18 and 20 may include, but not limited to, silicon oxide, silicon nitride, silicon carbide, silicon oxy-nitride, low-k or ultra low-k (ULK) materials such as organic (e.g., SILK) or inorganic (e.g., HSQ), or a combination thereof. A passivation layer 22 overlies at least a portion of the IMD layer 20. The passivation layer 22 may be silicon oxide, silicon nitride, silicon carbide, silicon oxy-nitride, polyimide, a combination thereof or the like. According to this embodiment, the passivation layer 22 has a thickness of about 0.5-6.0 micrometers, but should be not limited thereto.

A multiple levels of metal interconnection 40 may be fabricated in the respective IMD layers 14, 16, 18 and 20. For the sake of simplicity, only $M_{n-2}$, $V_{n-2}$, $M_{n-1}$ and $M_n$ are explicitly shown in the figures. An RF device, such as an inductor 200 which may comprise a first winding 24 and a second winding 26 in close proximity to the first winding 24, is fabricated in the top metal layer ($M_n$) within the inductor forming region 101 of the integrated circuit chip 1a. According to the embodiment of this invention, the top metal layer ($M_n$) has a thickness h that is not less than 0.5 micrometers. In some embodiments, the top metal layer has a thickness not less than 1.0 micrometer. In some further embodiments, the top metal layer has a thickness not less than 3.0 micrometer. The sidewalls and top surfaces of the first winding 24 and the second winding 26 of the inductor 200 could be covered with the passivation layer 22.

The integrated circuit chip 1a further comprises a bonding pad forming region 102. At least one bonding pad 214 can be formed in any metal layer that is lower than the top metal layer $M_n$, for example, the metal layer $M_{n-2}$, within the bonding pad forming region 102. An opening 302 is formed in the passivation layer 22 and the IMD layers 16, 18 and 20 to expose at least a portion of the top surface of the bonding pad 214 such that a bond wire 30 may be stuck to the bonding pad 214 in a package assembly stage. The opening 302 may have a depth of about 1.0-8.0 micrometers. It is noteworthy that a supporting structure under the bonding pad 214 can be omitted, as shown in FIG. 2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An integrated circuit chip comprising:
a substrate;
a plurality of inter-metal dielectric (IMD) layers including a topmost IMD layer on the substrate;
at least an RF device on the topmost IMD layer; and
at least one bonding pad under the topmost IMD layer.

2. The integrated circuit chip according to claim 1 further comprising an opening exposing at least a portion of the bonding pad.

3. The integrated circuit chip according to claim 2 further comprising:
 a passivation layer covering the RF device;
 wherein the opening is formed in the topmost IMD layer and the passivation layer.

4. The integrated circuit chip according to claim 1 wherein the RF device is disposed in a topmost metal layer comprising an aluminum layer.

5. The integrated circuit chip according to claim 4 wherein the topmost metal layer is a redistribution layer (RDL).

6. The integrated circuit chip according to claim 4 wherein the topmost metal layer has a thickness not less than 0.5 micrometer.

7. The integrated circuit chip according to claim 1 wherein the bonding pad is disposed in a lower metal layer comprising an aluminum layer.

8. The integrated circuit chip according to claim 1 further comprising a supporting structure situated under the bonding pad.

9. The integrated circuit chip according to claim 3 wherein the passivation layer comprises silicon oxide, silicon nitride, silicon carbide, silicon oxy-nitride, polyimide or a combination thereof.

10. The integrated circuit chip according to claim 3 wherein the passivation layer has a thickness of about 0.5-6.0 micrometers.

11. An integrated circuit chip comprising:
 a substrate;
 an inductor over the substrate within an inductor forming region; and
 at least one bonding pad under the inductor within a bonding pad forming region, wherein a top surface of the bonding pad is lower than a bottom surface of the inductor.

12. The integrated circuit chip according to claim 11, further comprising:
 a topmost inter-metal dielectric (IMD) layer between the top surface of the bonding pad and the bottom surface of the inductor;
 a passivation layer covering the inductor; and
 an opening in the passivation layer and the topmost IMD layer to expose at least a portion of the bonding pad.

13. The integrated circuit chip according to claim 11 wherein the inductor is disposed in a topmost metal layer comprising an aluminum layer.

14. The integrated circuit chip according to claim 13 wherein the topmost metal layer is a redistribution layer (RDL).

15. The integrated circuit chip according to claim 13 wherein the topmost metal layer has a thickness not less than 0.5 micrometer.

16. The integrated circuit chip according to claim 11 wherein the bonding pad is disposed in a lower metal layer comprising an aluminum layer.

17. The integrated circuit chip according to claim 11 further comprising a supporting structure situated under the bonding pad.

18. The integrated circuit chip according to claim 12 wherein the passivation layer comprises silicon oxide, silicon nitride, silicon carbide, silicon oxy-nitride, polyimide or a combination thereof.

19. The integrated circuit chip according to claim 12 wherein the passivation layer has a thickness of about 0.5-6.0 micrometers.

20. The integrated circuit chip according to claim 11 wherein the integrated circuit chip includes an RF integrated circuit using the inductor.

* * * * *